United States Patent [19]

Cook

[11] Patent Number: 5,334,935
[45] Date of Patent: Aug. 2, 1994

[54] APPARATUS AND METHOD FOR DETECTING WEAK MAGNETIC FIELDS HAVING A SATURABLE CORE SHAPED TO CANCEL MAGNETIC FIELDS PARALLEL TO THE CORE

[75] Inventor: Steven L. Cook, Duncan, Okla.

[73] Assignee: Halliburton Company, Duncan, Okla.

[21] Appl. No.: 966,931

[22] Filed: Oct. 27, 1992

[51] Int. Cl.⁵ .................... G01R 33/04; G01R 33/02
[52] U.S. Cl. ................................................ 324/253
[58] Field of Search ............... 324/244, 253, 254, 255, 324/260

[56] References Cited

U.S. PATENT DOCUMENTS

| | | | |
|---|---|---|---|
| 3,458,802 | 7/1969 | Koerner | 324/253 |
| 4,739,263 | 4/1988 | Mohri et al. | 324/253 |

OTHER PUBLICATIONS

"Review on Recent Advances in the Field of Amorphous-Metal Sensors and Transducers," *IEEE Transactions on Magnetics*, vol. Mag-20, No. 5 (Sep. 1984).
"Soft Magnetic Materials," *Proceedings of the IEEE*, vol. 78, No. 6 (Jun. 1990).
"Amorphous Magnetic Materials," *Encyclopedia of Chemical Technology with Interscience*, vol. 2, 3rd Ed. (Wiley Interscience 1980).

*Primary Examiner*—Walter E. Snow
*Attorney, Agent, or Firm*—Stephen R. Christian; Larry R. Watson

[57] ABSTRACT

Apparatus and method for detecting the presence of extraneous magnetic fields having a predetermined weak magnitude include a transformer having an excitation winding, an output winding, and a saturable core which will saturate in a magnetic field of a predetermined saturation magnitude. The core is made of amorphous metal alloy and is shaped to cancel the electromagnetic effects of magnetic fields having flux lines which are substantially parallel with respect to the transformer. An excitation circuit is connected to the excitation winding for generating a magnetic field having an excitation magnitude of lesser magnitude than the saturation magnitude of the core. The excitation magnitude and the weak magnitude of the extraneous magnetic fields combine to create a magnetic field of greater magnitude than the saturation magnitude of the core. A detector circuit is connected to the output winding for detecting and indicating saturation of the core.

18 Claims, 4 Drawing Sheets

APPARATUS AND METHOD FOR DETECTING WEAK MAGNETIC FIELDS HAVING A SATURABLE CORE SHAPED TO CANCEL MAGNETIC FIELDS PARALLEL TO THE CORE

BACKGROUND OF THE INVENTION

This invention relates to magnetic field sensors and, more particularly, but not by way of limitation, relates to magnetic field sensors for detecting the presence of weak magnetic fields, such as magnetic fields weaker than the earth's magnetic field.

Various types of magnetic field sensors or detectors are known and used in many industries for many purposes, including motion detection and flow measurement. One of the technological barriers in the development of magnetic field sensors has been the earth's magnetic field. In order to reduce power consumption and increase sensitivity and accuracy of magnetic field sensors, it is desirable to operate at or detect magnetic fields of weak magnitude. The earth's magnetic field has presented a barrier in that it has been necessary to operate at magnetic field magnitudes sufficiently above the earth's magnetic field to avoid interference and false signals.

For example, turbine meters are commonly used to measure the flow of fluids, including gases. Because of the low mass characteristic of gases, the turbine meters used to measure gas are very delicate and sensitive. Typically, gas flow turbine meters have ferrous blades and magnetic sensors are used to detect the motion of the blades. In order to avoid interference by the earth's magnetic field, the magnetic sensors typically create a magnetic field much stronger than the earth's magnetic field.

For example, eddy current sensors are available which will detect the motion of turbine meter blades without interfering with the blades' motion. In order to create a "sensing" magnetic field which is of sufficient strength to avoid interference by the earth's magnetic field, the eddy current sensors typically require approximately 10 milliamps of electrical current and therefore require a continuous power supply. An alternative to eddy current sensors is the use of a sensor having a permanent magnet, such as a magnetic reluctance type sensor. The amplitude and frequency of the output signal of the magnetic reluctance sensors are functionally related to the rotational speed of the turbine meter blades and, therefore, in order to measure low flow rates, the magnetic reluctance sensor needs to create a relatively large flux density (on the order of 82 gauss). This flux density tends to lock the ferrous blades of the turbine meter in position until a minimum flow having sufficient energy to overcome the magnetic field is present.

Therefore, there is a need for a magnetic flow sensor which will detect weak magnetic fields (on the order of magnitude of the earth's magnetic field) at low levels of power consumption. There is also a need for such a sensor which will not interfere with the operation of delicate instruments, such as gas flow turbine meters.

SUMMARY OF THE INVENTION

The present invention is contemplated to overcome the foregoing deficiencies to meet the above-described needs. In accomplishing this, the present invention provides a novel and improved apparatus and method for detecting the presence of extraneous magnetic fields having a predetermined weak magnitude.

The invention includes a transformer having an excitation winding, an output winding, and a saturable core which will saturate in a magnetic field of a predetermined saturation magnitude. The preferred core is made of amorphous metal alloy. Preferably, the core is shaped to cancel the electromagnetic effects of magnetic fields having flux lines which are substantially parallel with respect to the transformer. More preferably, the core is substantially S-shaped with the center leg of the S-shape extending through the central cavity of the excitation and output windings and the outside legs of the S-shape extending along the outside surface of the windings.

The apparatus includes excitation means, connected to the excitation winding, for generating a magnetic field having an excitation magnitude of lesser magnitude than the saturation magnitude of the core. The excitation magnitude and the weak magnitude of the extraneous magnetic field combine to create a magnetic field of greater magnitude than the saturation magnitude of the core, thereby saturating the core in the presence of the extraneous magnetic field. Detection means may be connected to the output winding for detecting and indicating saturation of the core.

It is an advantage of the present invention to detect magnetic fields weaker than the earth's magnetic field at low levels of power consumption.

It is an advantage of the present invention to provide apparatus and method for detecting magnetic fields which operate on a micropower consumption level.

It is an advantage of the present invention to provide apparatus and method for detecting magnetic fields which are compatible with transistor-transistor logic (TTL) circuits, i.e., which conform to TTL conventions and may be connected directly to a TTL circuit without level translation, debounce circuits, or other signal cleanup.

It is an advantage of the present invention to utilize low cost, commercially available components which are available in surface mount packaging.

It is an advantage of the present invention to operate with supply voltages that range from 3 to 12 volts DC.

It is an advantage of the present invention to provide a sensor which will detect the motion of turbine meter blades without interfering with the blades' motion.

It is an advantage of the present invention to produce a uniform TTL-level output amplitude which is independent of the speed of rotation of the turbine meter blades.

BRIEF DESCRIPTION OF THE DRAWINGS

The present invention will be better understood by reference to the example of the following drawings.

DETAILED DESCRIPTION OF THE PREFERRED EMBODIMENTS

Figure 1:
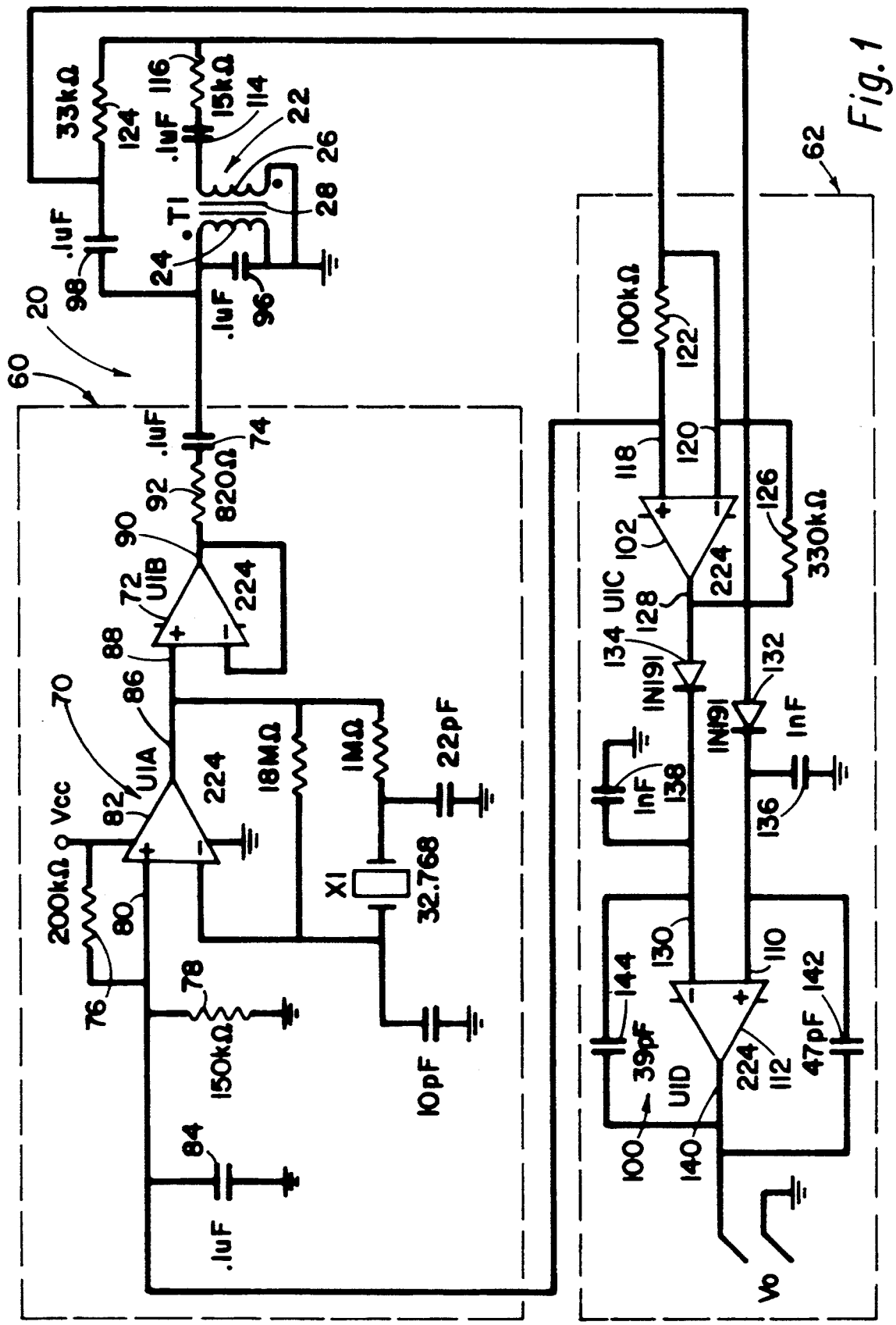
FIG. 1 is a circuit diagram of an embodiment of the present invention.

Preferred embodiments of the invention will now be described with reference to the drawings, wherein like reference characters refer to like or corresponding parts throughout the drawings and description.

FIGS. 1–4 present embodiments of the apparatus and method of the present invention, generally designated 20, for detecting the presence of extraneous magnetic fields having a predetermined weak magnitude. By "weak" magnetic fields is meant fields having a magnitude of less than 5 gauss. Although the preferred embodiment, and the apparatus and method as described herein, are used for measuring weak magnetic fields, it is intended to be understood that the invention may be adapted to measure magnetic fields of virtually any strength. Also, although the apparatus and method 20 are described herein, by way of example, as being used with a turbine meter, it is intended to be understood that the invention is generally applicable to the art of magnetic field sensing.

Figure 2:
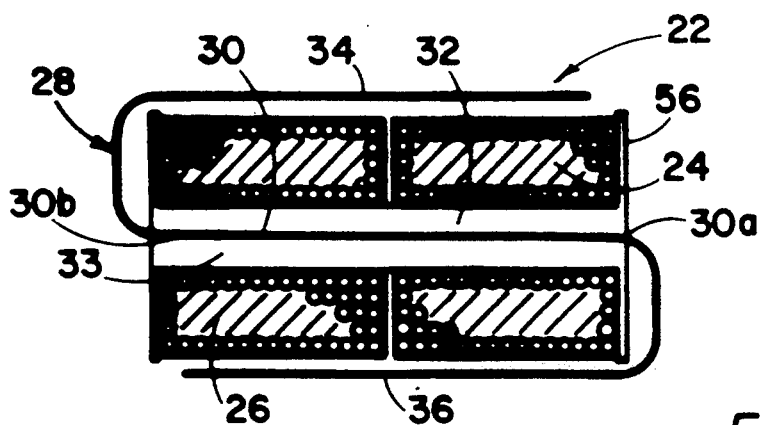
FIG. 2 is a cross-sectional view of an embodiment of a transformer of the present invention.

Referring to the example of FIG. 2, the apparatus 20 may be generally described as including a transformer 22 having an excitation winding 24, an output winding 26, and a saturable core 28. The core 28 will saturate in a magnetic field having a predetermined saturation magnitude. In the preferred apparatus 20, the core 28 will saturate in a magnetic field having a magnitude lower than the magnitude of the earth's magnetic field, i.e., lower than 0.5 oersted or 0.57 gauss. The core 28 may be selected, in conjunction with the transformer windings 24, 26, to provide desired saturation characteristics. A core is "saturated" when increases in the strength of the magnetic field to which the core is exposed cease to have significant effect on the magnetic flux density induced in the core by the magnetic field. When the core of a transformer is saturated, increases in the excitation current of the excitation winding and increases in the strength of the magnetic field to which the transformer is exposed cease to increase magnetic flux density in the core and the current induced in the output winding.

The preferred core 28 is made of an amorphous metal alloy. More preferably, the core 28 is an amorphous metal foil. The core 28 may be of virtually any shape and, for example, may be a straight or linear strip of amorphous metal foil. However, amorphous foils are typically directionally sensitive to magnetic fields and the amorphous foil selected for use as the core of a transformer will typically be more sensitive to magnetic fields directed along its longitudinal axis than along its transverse axis. Therefore, the sensitivity of a transformer 22 having a linear or straight amorphous core 28 will vary with its orientation with respect to the magnetic field to be sensed as well as to other magnetic fields.

The preferred core 28 is shaped to reduce the electromagnetic effects of magnetic fields having flux lines 42 which are substantially parallel with respect to the transformer 22, such as the earth's magnetic field (hereinafter referred to as "remote" magnetic fields), regardless of the orientation of the core with respect to the remote magnetic field. The prototype core 28 is substantially S-shaped and the center leg 30 of the S-shape extends through the central cavities 32, 33 of the excitation and output windings 24, 26. The outside legs 34, 36 of the S-shaped core 28 extend along the outside surface of the windings 24, 26. Referring to the examples of FIGS. 3–5, it is seen that substantially parallel flux lines 42 will create magnetic poles on the core 28, i.e., S (south) poles on the ends of the core 28 where the flux lines 42 enter the core 28 and N (north) poles on the ends of the core 28 where the flux lines 42 exit the core 28. Since flux lines always close, i.e., connect from a north pole to a south pole of the source of the flux lines, and are repelled from poles of the same polarity, it is contemplated, as illustrated in FIGS. 3–4, that the arrangement of poles on an S-shaped core, when exposed to substantially parallel flux lines 42, will force the paths of the flux lines 44, 46 induced by the remote magnetic field and flux lines 42 away from the center leg 30 so that the flux lines 44, 46 will not contribute significantly to the magnetic flux through, and saturation of, the center leg 30 of the core 28.

Figure 3:
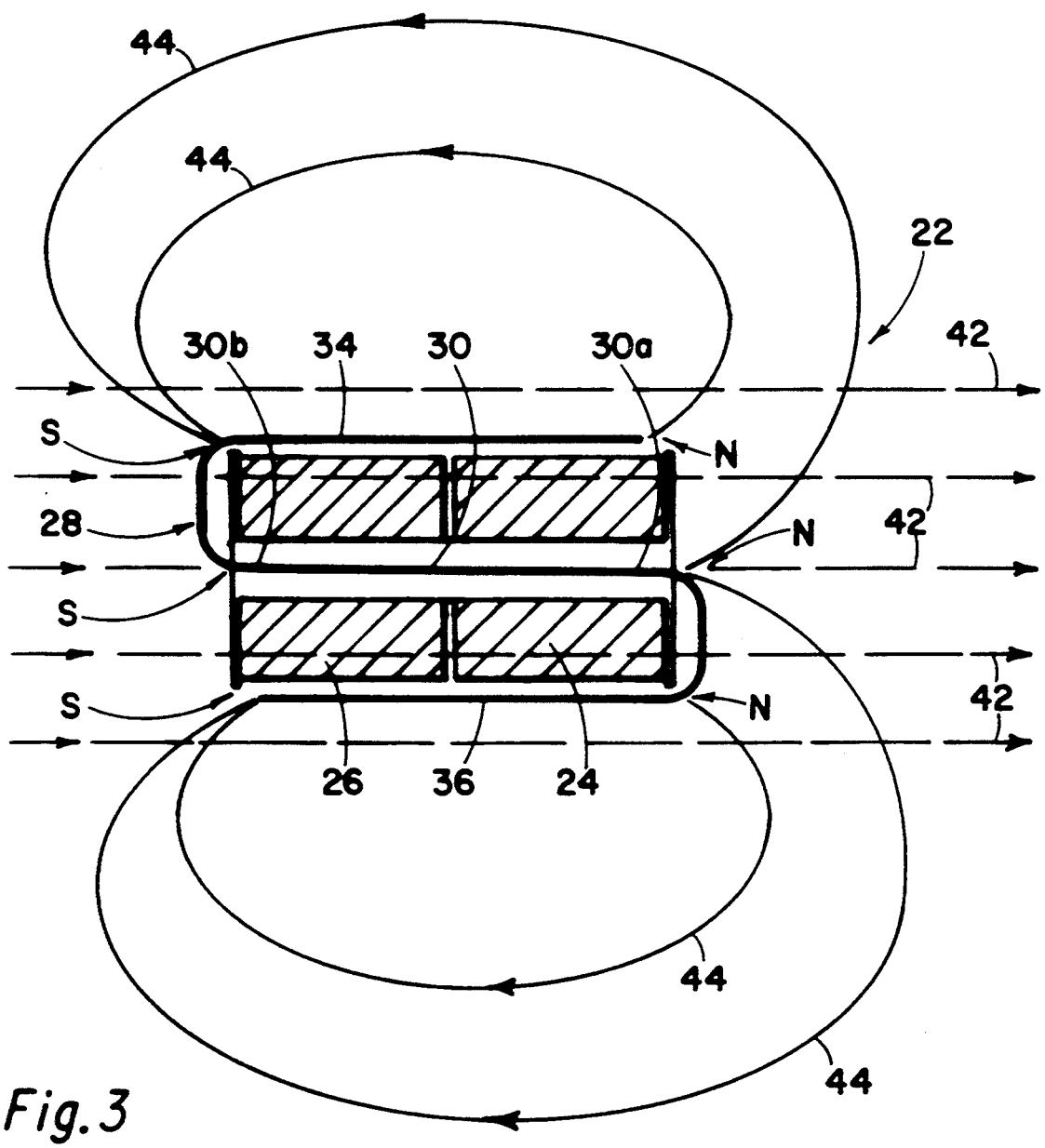
FIG. 3 is a cross-sectional view of a transformer of the present invention illustrating the effects of a remote magnetic field which is parallel to the longitudinal axis of the transformer.

Referring to the example of FIG. 3, which illustrates the effect of a remote magnetic field having flux lines 42 which are about parallel with the longitudinal axis of the transformer 22 and core 28, it is contemplated that some of the induced flux lines 44 emanating from the north pole of the center leg 30 will connect with the south poles of the outer legs 34, 36 (rather than the south pole of the center leg 30) because of the repellent influence of the north poles on the outer legs 34, 36 on the paths of the flux lines 42. In contrast, if the core 28 were a straight or linear core which did not have the outer legs 34, 36 and consequently had only the one south pole on the linear core, the flux lines 44 would all connect to the south pole of the center, linear core which would increase the flux through the core and thereby drive it toward or into saturation. This is important in that it is the center leg 30 of the core 28 (the portion of the core which lies in the central cavities 32, 33 of the windings 24, 26) that largely determines whether the transformer 22 is in saturation, i.e., whether increasing excitation of the transformer increases the output signal from the output winding 26.

Figure 4:
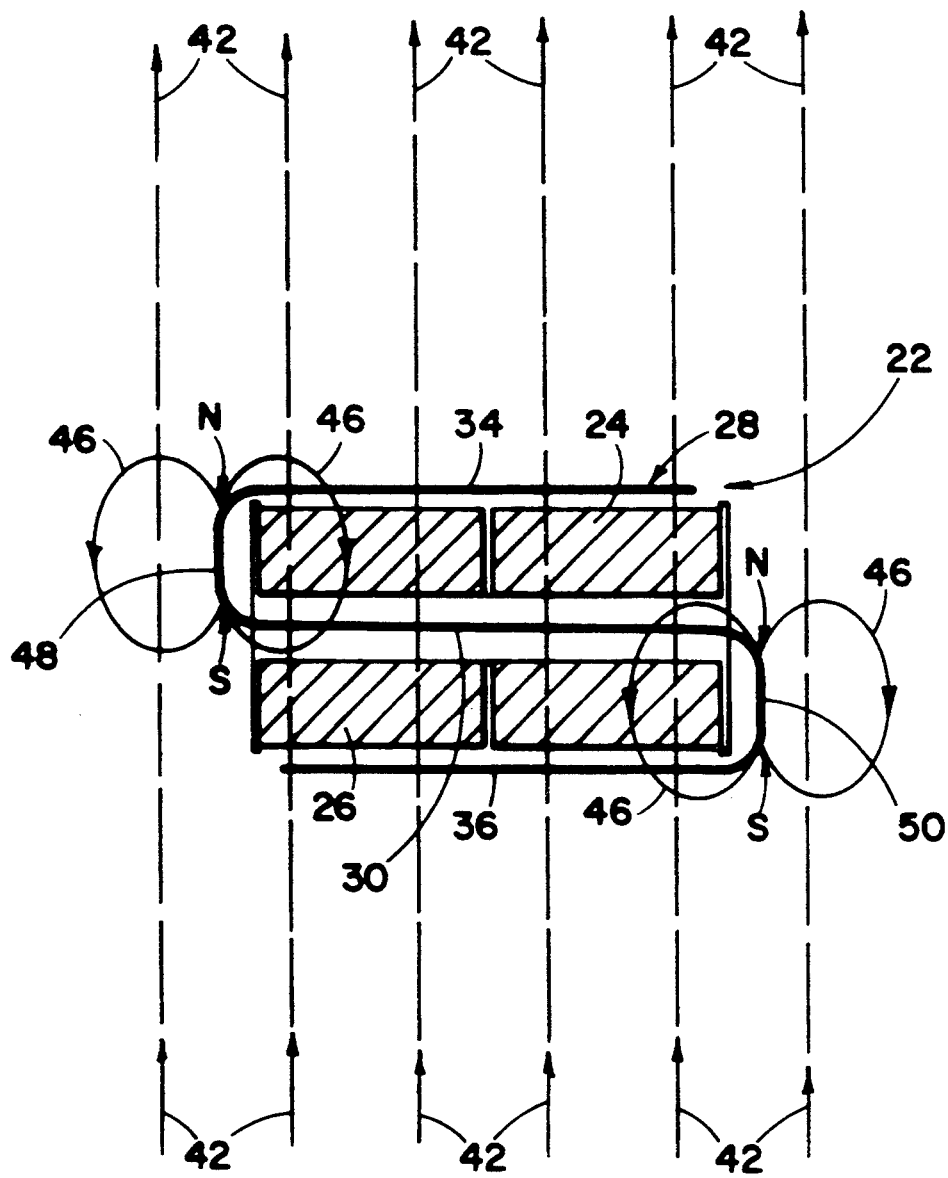
FIG. 4 is a cross-sectional view of a transformer of the present invention illustrating the effects of a remote magnetic field which is perpendicular to the longitudinal axis of the transformer.

FIG. 4 illustrates the effect of a remote magnetic field in which the parallel flux lines 42 are about perpendicular to the longitudinal axis of the core 28 and transformer 22. The effects of the perpendicular remote magnetic field 42 at points where the flux lines 42 are perpendicular to the core 28 can be ignored as having little effect on the flux along the longitudinal axis of the core 28 and on the saturation of the central leg 30 of the core 28 along its longitudinal axis. FIG. 4 illustrates that the perpendicular remote magnetic field will induce flux lines 46 about and through the elbows 48, 50 of the core 28 which will not significantly affect the flux through the center leg 30 of the core 28.

Figure 5:
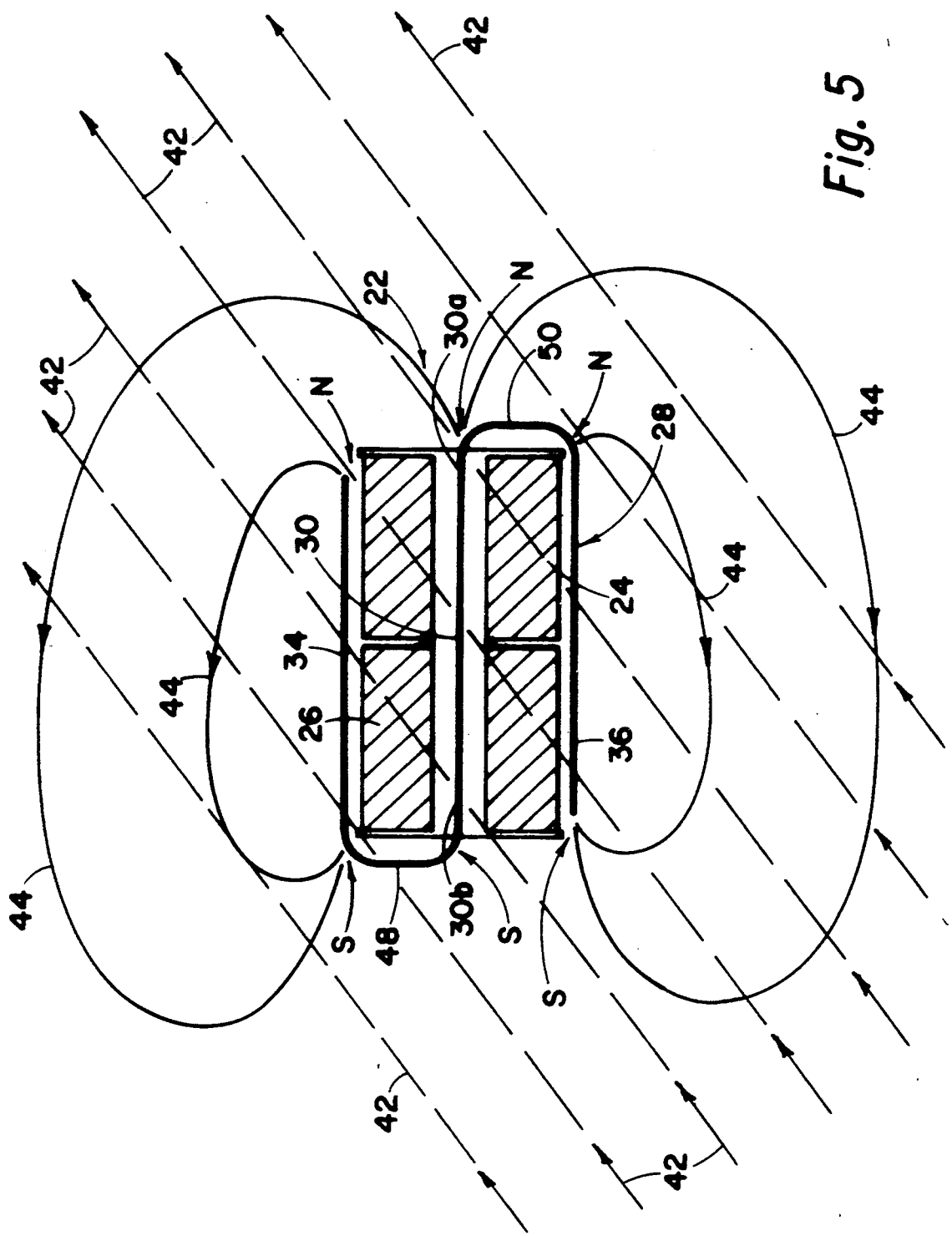
FIG. 5 is a cross-sectional view of a transformer of the present invention illustrating the effects of a remote magnetic field which is skewed with respect to the longitudinal axis of the transformer.

FIG. 5 illustrates the effects of the vector components of a remote magnetic field having substantially parallel flux lines 42 which are skewed with respect to the longitudinal axis of the transformer 22 and core 28. As illustrated in FIG. 5, it is contemplated that the vector components of the skewed remote magnetic field which are parallel with the longitudinal axis of the core 28 will have the same effect on the core 28 as discussed with FIG. 3. The vector components of the remote magnetic field which are perpendicular to the longitudinal axis of the core 28, which would normally have the effect on the elbows 48, 50 discussed with FIG. 4, will be largely cancelled. Since the core 28 is more sensitive along its longitudinal axis, the poles N, S created by the longitudinal vector components will normally be stronger and will override and cancel the poles needed to create flux paths 46 on the elbows 48, 50. In other words, it is not possible to have a north pole and a south pole at the same point and the north poles and south poles created by the longitudinal vector component on the elbows 48, 50 and flux lines 44 will prevent the creation of the flux lines 46 illustrated in FIG. 4.

In summary, as illustrated in FIGS. 3–5 and the preceding discussion thereof, it is contemplated that the ability of the S-shaped core to reduce the electromagnetic effects of magnetic fields having substantially parallel flux lines 42 will be present regardless of the orientation of the longitudinal axis of the transformer 22 and core 28 with respect to the remote magnetic fields.

When a "local" magnetic field having flux lines which curve in small radii (relative to the transformer 22 and core 28), such as a field created by a magnetized turbine meter blade, passes near the transformer 22, it creates poles N, S of greater strength at the nearest end of the core 28 to the blade (which will normally be an end 30a, 30b of the central leg 30) which, together with the motion of the local field, induces a magnetic field through the central leg 30 of the core 28 which may be designed and calculated to drive the central leg 30 and the transformer 22 into saturation.

As previously mentioned, the core 28 should be selected, in conjunction with the transformer windings 24, 26, to provide desired saturation characteristics. Examples of suitable amorphous metal alloys include the following from the Metglas Products Division of Allied Signal, Inc.: 2605SC, 2605CO, 2605SM, 2605S3A, 2605TCA, 2705M, and 2826MV. In the prototype apparatus 20, the core is a 2.1 inch by 0.0625 inch by 0.0006 inch strip of Metglas 2714A as-cast amorphous foil which saturates in a magnetic field intensity of approximately 0.2 oersted (0.3 oersted below the earth's magnetic field). The S-shape of the core 28 should be designed to remain within the stress limits imposed by the material of the core, i.e., overstressing or overbending affects the magnetic properties of some amorphous metal alloys. The core 28 should be selected to have a minimum saturation level in order to minimize the power consumption of the apparatus 20.

The windings 24, 26 should be arranged so that the major portion of the flux linkage or coupling between the windings 24, 26 which is created by the excitation signal will pass through the core 28. In other words, it is desirable not to overcouple the windings 24, 26 in such a manner that the inductive coupling in the transformer is created by direct coupling between the windings 24, 26 rather than by the core 28, as doing so decreases the sensitivity of the output winding 26 to the flux through the core 28. It is the effect of the core flux on the output winding 26 which is monitored to detect saturation of the core 28 and the presence of an extraneous magnetic field. Referring to the example of FIG. 2, the prototype transformer 22 is built on a standard bobbin 56. The windings 24, 26 are placed end-to-end. Each winding has 200 turns of No. 42 magnet wire. Other configurations of the windings 24, 26 may be used, although it is contemplated that the end-to-end configuration of the prototype windings 24, 26 will have the best sensitivity, as previously discussed.

Referring to the example of FIG. 1, in the preferred embodiment, the apparatus 20 includes excitation means 60 and detection means 62. The excitation means 60 is connected to the excitation winding 24 for generating or inducing a magnetic field having an excitation magnitude of lesser magnitude than the saturation magnitude of the core 28. The apparatus 20 is designed such that the excitation magnitude and the weak magnitude of the extraneous magnetic field (such as the extraneous magnetic field created by a turbine meter blade) combine to create a magnetic field of greater magnitude than the saturation magnitude of the core 28. The excitation means 60 may be any oscillating power source, such as an alternating current source, which may be connected to the excitation winding 24 to provide the time varying electrical power needed to generate a magnetic field with the excitation winding 24.

The detection means 62 is connected to the output winding 26 for detecting and indicating saturation of the core 28. When the core 28 saturates, the voltage drop across the output winding 26 and the current flowing through the output winding 26 will cease to increase with increases in the strength of the magnetic field created by the excitation winding or with increases in the magnitude of the extraneous magnetic field. The detection means may be any type of voltage, current, or magnetic field detector or detection circuit 62 which will detect this truncation or flattening out in the output signal of the output winding 26.

Referring to FIG. 1, the prototype apparatus 20 includes excitation means 60 and detection means 62 which operate at a micropower level. This allows the apparatus 20 to be battery operated and used in locations where a continuous power supply is not readily available. In the prototype apparatus 20, the excitation means 60 includes an oscillator 70, a buffer amplifier 72 connected between the oscillator 70 and the excitation winding 24, and a capacitor 74 connected in electrical series between the buffer amplifier 72 and the excitation winding 24 in order to prevent direct current coupling between the amplifier 72 and the excitation winding 24 and thereby reduce the power consumption of the apparatus 20.

The oscillator 70 is a crystal-controlled oscillator which operates at 32.768 kilohertz. $V_{cc}$ is a 5-volt DC power supply which is connected to the power terminals of the operational amplifiers of the apparatus 20. Resistors 76, 78 are connected to $V_{cc}$ and form a voltage divider. The positive input 80 of the operational amplifier 82 of the oscillator 70 is connected in electrical parallel to resistor 78 so that $V_{cc}$ provides a biasing voltage of approximately 2 volts DC to the positive input 80 of the operational amplifier 82 and thereby prevents clipping of the AC excitation signal output by the oscillator 70.

Capacitor 84 is connected to ground in parallel with resistor 78 in order to bypass any AC ripple present at the positive input 80 to ground and thereby keep the positive input 80 biased at a relatively constant DC level. The output 86 of operational amplifier 82 is connected to the positive input 88 of the buffer amplifier 72. The buffer amplifier 72 serves as a voltage follower which reduces harmonics in the excitation signal coming from the output 86 by preventing the transformer 22 from loading the oscillator 70.

From the output 90 of the buffer amplifier 72, the excitation signal passes in electrical series through resistor 92 and capacitor 74. Resistor 92 and capacitor 74 provide RC matching for the excitation winding 24. The capacitor 74 also breaks direct current coupling between the buffer amplifier 72 and the excitation winding 24 in order to reduce power consumption. The capacitor 74 has little reactance at the frequency of the oscillator 70 and excitation signal and therefore blocks direct current but passes the high frequency excitation signal. The capacitor 74 provides good direct current isolation between the excitation means 60 and the transformer 22. This prevents the loading effects on the output of the buffer amplifier 72 which would otherwise be created by the low DC resistance of the transformer 22.

Capacitor 96 is connected in electrical parallel with the excitation winding 24 to create a parallel tuned tank circuit which provides a very high impedance to the excitation signal, thereby reducing the current required to excite the excitation winding 24. The current supplied to the excitation winding 24 is approximately 260 milliamps which produces a field of intensity of 0.13 oersted. This is 0.07 oersted below the field required to saturate the prototype amorphous core 28. From capacitor 98, the excitation signal is also supplied to the detection means 62. The excitation signal passes through capacitor 98 in order to provide direct current isolation between the excitation means 60 and detection means 62 and between the windings 24, 26.

The preferred detection means 62 includes a comparator circuit 100, connected to the output winding 26 of the transformer 22, for comparing the output signal of the output winding to a reference signal in order to determine whether the core 28 is saturated and for outputting one of a relatively high signal or a relatively low signal when the core 28 is saturated. Preferably, the excitation signal is used as the reference signal. The preferred detecting means 62 also includes an output amplifier 102, connected between the output winding 26 and the comparator circuit 100, for amplifying the output signal of the output winding 26, as will be further discussed below. From capacitor 98, the excitation signal is connected to positive terminal 110 of the operational amplifier 112 of the comparator circuit 100 in order to provide the reference signal. The excitation signal is used as the reference signal so that the reference signal will track changes in the AC characteristics of the excitation circuit 60, detection circuit 62, and output signal of the output winding 26.

The output signal of the output winding 26 of the transformer 22 is used to determine whether the core 28 is in saturation. From the output winding 26, the output signal passes through capacitor 114, which provides direct current isolation for the output winding 26, and resistor 116 to the output amplifier 102. The resistor 78 of the voltage dividing circuit is connected in electrical parallel with the positive input 118 of the operational amplifier 102 in order to bias the amplifier 102 into its linear operating range. This biasing voltage is supplied to the negative input 120 of output amplifier 102 through resistor 122. The capacitor 84 effectively grounds any AC component at the positive input 118 of the amplifier 102 so that the positive input 118 stays at a relatively constant DC voltage level.

The negative input 120 of the output amplifier 102 serves as an AC summing amplifier for the AC voltages of the excitation signal coming from resistor 124 and the output signal coming from resistor 116. The amplifier 102 sums the voltages of the excitation signal and the output signal such that the amplifier 102 has a low AC voltage amplitude under nonsaturated conditions and a high AC voltage amplitude under saturated conditions. The excitation signal and the output signal are summed 180° out of phase because of the phase shift across the transformer 22. When the core 28 is not saturated, the phase difference between the excitation signal and the output signal, as summed at the negative input 120, reduces the amplitude of the signal applied to negative input 120 causing the output of the amplifier 102 to have a relatively low amplitude. When the core 28 is saturated from the influence of an extraneous magnetic field, the output signal from the output winding 26 drops in AC voltage magnitude and has less of a cancelling effect on the excitation signal and therefore the amplitude of the summed signal at the negative input 120 increases, causing the output of the amplifier 102 to increase in AC voltage amplitude. This increase is boosted by the gain across the amplifier 102 created by feedback resistor 126.

The output pin 128 of amplifier 102 is connected to the negative input 130 of comparator amplifier 112. Diodes 132, 134 and capacitors 136, 138 on the inputs 110, 130 to the comparator amplifier 112 are rectifying circuits which hold the inputs at the peak voltages they respectively receive. Since the excitation/reference signal is connected to the non-inverting, positive input 110 of the comparator amplifier 112, the amplifier 112 will have a relatively high output signal when pin 110 is at a higher magnitude than pin 130 (as is the case when the core 28 is not saturated). When the core 28 is saturated, the output of amplifier 102 increases to a larger magnitude than the reference signal, causing negative input 130 to have a larger magnitude than positive input 110 which reduces the output at pin 140 of the comparator amplifier 112 to approximately 0 volts. Capacitors 142, 144 are connected across the comparator amplifier 112 to stabilize the output of the amplifier 112 and prevent the output from chattering so that there will be no oscillations in the output at pin 140 unless the core 28 is actually oscillating above and below saturation.

In the prototype apparatus, the operational amplifiers 72, 82, 102, 112 are micropower op-amps and are mounted on one chip, commonly known as a "quad op-amp." The oscillator 70 draws approximately 350 microamps; and the buffer amplifier 72, output amplifier 102, and comparator amplifier 112 each draw approximately 150 microamps. The windings 24, 26 and core 28 should be designed in conjunction with the excitation circuit 60 such that the excitation signal induces a magnetic field in the excitation winding 24 having an excitation magnitude sufficiently close to the saturation level or saturation magnitude of the core 28 that the extraneous magnetic field will combine with the field of the excitation winding to saturation the core 28. In other words, the peaks of the magnetic field induced in the excitation winding 24 by the excitation signal should be sufficiently near to the saturation level of the core 28 that the extraneous magnetic field will drive the core 28 into saturation. In the prototype apparatus, the core 28 saturates between 2.5 and 3.0 gauss and unsaturates when the strength of the extraneous magnetic field drops below approximately 0.9 gauss. When the prototype apparatus 20 is used with a turbine meter, the turbine blades should be sufficiently magnetized to provide an extraneous magnetic field having a magnetic induction of 1 to 2 gauss.

The method of detecting the presence of extraneous magnetic fields having a predetermined weak magnitude includes providing a transformer 22 having an excitation winding 24, an output winding 26, and a saturable core 28 which will saturate in a magnetic field of predetermined saturation magnitude. The preferred core 28 is made of amorphous metal alloy. The method provides for shaping the core 28 to cancel the electromagnetic effects of magnetic fields having flux lines 42 which are substantially parallel with respect to the transformer 22, as exemplified in FIGS. 3 and 4. The method further provides for shaping the core 28 into a substantially S-shaped core 28 and disposing the S-shaped core 28 with the center leg 30 of the S-shaped core extending through the central cavities 32, 33 of the excitation and output windings 24, 26 and with the outside legs 34, 36 of the S-shaped core extending along the outside surface of the windings 24, 26.

Referring to FIG. 1, the method provides for connecting an excitation signal to the excitation winding 24 and thereby generating or inducing a magnetic field having an excitation magnitude of lesser magnitude than the saturation magnitude of the core 28. The excitation magnitude of the generated magnetic field and the weak magnitude of the extraneous magnetic field combine to create a magnetic field of greater magnitude than the saturation magnitude of the core. The connecting an excitation signal step includes providing an oscillator 70, connecting a buffer amplifier 72 between the oscillator 70 and the excitation winding 24, and connecting a capacitor 74 in electrical series between the buffer amplifier 72 and the excitation winding 24 in order to prevent direct current coupling between the buffer amplifier 72 and the excitation winding 24.

The method provides for detecting saturation of the core 28. The detecting step includes comparing an output signal of the output winding 26 to a reference signal in order to determine whether the core 28 is saturated; and outputting one of a relatively high signal or a relatively low signal when the core 28 is saturated. Preferably, the reference signal is the excitation signal. The detecting step further provides for amplifying the output signal of the output winding 26 before the output signal is compared to the reference signal.

While presently preferred embodiments of the invention have been described herein for the purpose of disclosure, numerous changes in the construction and arrangement of parts and the performance of steps will suggest themselves to those skilled in the art in view of the disclosure contained herein, which changes are encompassed within the spirit of this invention, as defined by the following claims.

What is claimed is:

1. Apparatus for detecting the presence of extraneous magnetic fields having a predetermined weak magnitude comprising:
    a transformer having an excitation winding, an output winding, and a saturable core made of amorphous metal alloy which will saturate in a magnetic field of a predetermined saturation magnitude, the core being shaped to cancel the electromagnetic effects of magnetic fields having flux lines which are substantially parallel with respect to the transformer;
    excitation means, connected to the excitation winding, for generating a magnetic field having an excitation magnitude of lesser magnitude than the saturation magnitude, the excitation magnitude and the weak magnitude of the extraneous magnetic field combining to create a magnetic field of greater magnitude than the saturation magnitude of the core; and
    detection means, connected to the output winding, for detecting and indicating saturation of the core.

2. Apparatus of claim 1:
    wherein the core is substantially S-shaped with the center leg of the S-shaped core extending through the central cavities of the excitation and output windings and the outside legs of the S-shaped core extending along the outside surface of the windings.

3. Apparatus of claim 1:
    wherein the saturation magnitude is about equal to or less than the magnitude of the earth's magnetic field.

4. Apparatus of claim 1 in which the excitation means comprises:
    an oscillator;
    a buffer amplifier connected between the oscillator and the excitation winding; and
    a capacitor connected in electrical series between the buffer amplifier and the excitation winding in order to prevent direct current coupling between the amplifier and the excitation winding.

5. Apparatus of claim 1 in which the detecting means comprises:
    a comparator circuit, connected to the output winding of the transformer, for comparing an output signal of the output winding to a reference signal in order to determine whether the core is saturated and for outputting one of a relatively high signal or a relatively low signal when the core is saturated.

6. Apparatus of claim 5:
    wherein the excitation means provides an excitation signal to the excitation winding; and
    wherein the excitation means is connected to the comparator circuit so that the excitation signal is the reference signal.

7. Apparatus of claim 6 in which the detecting means comprises:
    an output amplifier, connected between the output winding and the comparative circuit, for amplifying the output signal of the output winding.

8. Apparatus for detecting the presence of extraneous magnetic fields having a predetermined weak magnitude comprising:
    a transformer having an excitation winding, an output winding, and a saturable core made of amorphous metal alloy which will saturate in a magnetic field of a predetermined saturation magnitude, the core being shaped to cancel the electromagnetic effects of magnetic fields having flux lines which are substantially parallel with respect to the transformer.

9. Apparatus of claim 8:
    wherein the core is substantially S-shaped with the center leg of the S-shaped core extending through the central cavities of the excitation and output windings and the outside legs of the S-shaped core extending along the outside surface of the windings.

10. Method of detecting the presence of extraneous magnetic fields having a predetermined weak magnitude comprising:
    providing a transformer having an excitation winding, an output winding, and a saturable core made of amorphous metal alloy which will saturate in a magnetic field of a predetermined saturation magnitude;
    shaping the core to cancel the electromagnetic effects of magnetic fields having flux lines which are substantially parallel with respect to the transformer;
    connecting an excitation signal to the excitation winding and generating a magnetic field having an excitation magnitude of lesser magnitude than the saturation magnitude of the core, the excitation magnitude of the generated magnetic field and the weak magnitude of the extraneous magnetic field combining to create a magnetic field of greater magnitude than the saturation magnitude of the core; and detecting saturation of the core.

11. Method of claim 10, comprising:

shaping the core into a substantially S-shaped core; and disposing the S-shaped core with the center leg of the S-shape extending through the central cavities of the excitation and output windings and with the outside legs of the S-shape extending along the outside surface of the windings.

12. Method of claim 10:

wherein the saturation magnitude of the core is about equal to or less than the magnitude of the earth's magnetic field.

13. Method of claim 10 in which the connecting an excitation signal step comprises:

providing an oscillator;

connecting a buffer amplifier between the oscillator and the excitation winding; and connecting a capacitor in electrical series between the buffer amplifier and the excitation winding in order to prevent direct current coupling between the buffer amplifier and the excitation winding.

14. Method of claim 10 in which the detecting step comprises:

comparing an output signal of the output winding to a reference signal in order to determine whether the core is saturated; and outputting one of a relatively high signal or a relatively low signal when the core is saturated.

15. Method of claim 14:

wherein the reference signal is the excitation signal.

16. Method of claim 15 in which the detecting step comprises:

amplifying the output signal of the output winding before the output signal is compared to the reference signal.

17. Apparatus which operates on a micropower consumption level for detecting the presence of extraneous magnetic fields having a predetermined weak magnitude, comprising:

(1) a transformer having an excitation winding, an output winding, and a saturable core which will saturate in a magnetic field of a predetermined saturation magnitude about equal to or less than the magnitude of the earth's magnetic field;

(2) excitation means, connected to the excitation winding, for generating a magnetic field having an excitation magnitude of lesser magnitude than the saturation magnitude, the excitation magnitude and the weak magnitude of the extraneous magnetic field combining to create a magnetic field of greater magnitude than the saturation magnitude of the core, the excitation means comprising:

an oscillator;

a buffer amplifier connected between the oscillator and the excitation winding; and a capacitor connected in electrical series between the buffer amplifier and the excitation winding in order to prevent direct current coupling between the amplifier and the excitation winding; and (3) detection means, connected to the output winding for detecting and indicating saturation of the core, comprising:

a comparator circuit, connected to the output winding of the transformer, for comparing an output signal of the output winding to a reference signal in order to determine whether the core is saturated and for outputting one of a relatively high signal or a relatively low signal when the core is saturated; and an output amplifier, connected between the output winding and the comparator circuit, for amplifying the output signal of the output winding.

18. Method of detecting, at a micropower consumption level, the presence of extraneous magnetic fields having a predetermined weak magnitude, comprising:

(1) providing a transformer having an excitation winding, an output winding, and a saturable core which will saturate in a magnetic field of a predetermined saturation magnitude about equal to or less than the magnitude of the earth's magnetic field;

(2) connecting an excitation signal to the excitation winding and generating a magnetic field having an excitation magnitude of lesser magnitude than the saturation magnitude of the core, the excitation magnitude of the generated magnetic field and the weak magnitude of the extraneous magnetic field combining to create a magnetic field of greater magnitude than the saturation magnitude of the core, the connecting step comprising the steps of:

providing an oscillator;

connecting a buffer amplifier between the oscillator and the excitation winding; and connecting a capacitor in electrical series between the buffer amplifier and the excitation winding in order to prevent direct current coupling between the buffer amplifier and the excitation winding; and (3) detecting saturation of the core, comprising the steps of: comparing an output signal of the output winding to a reference signal in order to determine whether the core is saturated;

outputting one of a relatively high signal or a relatively low signal when the core is saturated; and amplifying the output signal of the output winding before the output signal is compared to the reference signal.

* * * * *